(12) United States Patent
Lung et al.

(10) Patent No.: US 6,927,136 B2
(45) Date of Patent: Aug. 9, 2005

(54) NON-VOLATILE MEMORY CELL HAVING METAL NANO-PARTICLES FOR TRAPPING CHARGES AND FABRICATION THEREOF

(75) Inventors: Hsiang-Lan Lung, Hsinchu (TW); Kuang-Yeu Hsieh, Hsinchu (TW); Ruichen Liu, Hsinchu (TW); Tai-Bor Wu, Hsinchu (TW); Jiun-Yi Tseng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/604,884

(22) Filed: Aug. 25, 2003

(65) Prior Publication Data

US 2005/0045943 A1 Mar. 3, 2005

(51) Int. Cl.[7] .............................................. H01L 21/336
(52) U.S. Cl. ............... 438/288; 438/591; 257/E21.625; 257/E29.309
(58) Field of Search ................................ 438/591, 216, 438/287, 288; 257/E29.309, E21.625

(56) References Cited

U.S. PATENT DOCUMENTS

| | | | |
|---|---|---|---|
| 5,768,192 A | 6/1998 | Eitan | |
| 5,783,263 A | 7/1998 | Majetich et al. | |
| 5,876,480 A | 3/1999 | Markowitz et al. | |
| 6,165,842 A | 12/2000 | Shin et al. | |
| 6,297,095 B1 | 10/2001 | Muralidhar et al. | |
| 6,303,516 B1 | 10/2001 | Morita et al. | |
| 6,342,716 B1 | 1/2002 | Morita et al. | |
| 6,413,819 B1 | 7/2002 | Zafar et al. | |
| 6,750,471 B2 * | 6/2004 | Bethune et al. | 257/40 |
| 2002/0086507 A1 * | 7/2002 | Park et al. | 438/585 |
| 2003/0235064 A1 * | 12/2003 | Batra et al. | 365/100 |

OTHER PUBLICATIONS

Wolf, "Silicon Processing for the VLSI Era", 1986, vol. 1, Lattice Press, pp. 340–359.*

* cited by examiner

Primary Examiner—George Fourson
Assistant Examiner—Thanh V. Pham
(74) Attorney, Agent, or Firm—Jiang Chyun IP Office

(57) ABSTRACT

A non-volatile memory cell is described. The non-volatile memory cell comprises a substrate, a charge-trapping layer, a gate and a source/drain. The charge-trapping layer comprises an insulating layer and metal nano-particles contained therein, wherein the metal nano-particles are formed with thermal dissociation of an oxide of the same metal. The gate is disposed on the charge-trapping layer, and the source/drain is located in the substrate beside the gate.

15 Claims, 3 Drawing Sheets

NON-VOLATILE MEMORY CELL HAVING METAL NANO-PARTICLES FOR TRAPPING CHARGES AND FABRICATION THEREOF

BACKGROUND OF INVENTION

1. Field of the Invention

The present invention relates to a semiconductor device and a method for fabricating the same. More particularly, the present invention relates to a non-volatile memory cell and a method for fabricating the same.

2. Description of the Related Art

Non-volatile memory devices that use charge-trapping mechanisms have been widely studied. An earlier trapping-type non-volatile memory device is the mirror-bit SONOS memory as described in U.S. Pat. No. 5,768,192, which uses a nitride layer disposed between two oxide layers for charge storage. Since silicon nitride is an insulating material and the charges trapped in the nitride trapping layer are localized, two bits can be stored in one memory cell as a hot charge injection mechanism used for programming.

Recently, a category of trapping-type non-volatile memory that uses isolated conductive nano-particles for charge storage has been proposed. For example, U.S. Pat. No. 6,342,716 B1 and U.S. Pat. No. 6,413,819 disclose a trapping-type non-volatile memory that uses isolated dot elements for charge storage. U.S. Pat. No. 6,165,842 discloses a method that forms silicon nano-crystals for charge storage by etching a polysilicon layer. U.S. Pat. No. 6,297,095 B1 discloses a method that forms silicon nano-crystals for charge storage with controlled LPCVD or UHVCVD. Besides, U.S. Pat. No. 6,303,516 B1 discloses a method that forms fine metal particles for charge storage by using an antigen-antibody pair binding method. In addition, U.S. Pat. Nos. 5,783,263 and 5,876,480 disclose other methods for making nano-crystals. U.S. Pat. No. 5,783,263 discloses a method that forms metal nano-particles by using carbon arc discharge on a graphite rod packed with the same metal, alloy, or oxide of metal or alloy. U.S. Pat. No. 5,876,480 discloses a method that forms metal nano-particles by reducing ions of the same metal with some catalytic metal ions that are carried by vesicles in a dispersion system.

To well control the electrical properties of a trapping-type non-volatile memory that uses nano-particles for charge storage, good uniformity in density of the nano-particles is required. Unfortunately, the nano-particles made with any one of the aforementioned methods in the prior art have poor uniformity, and the electrical properties of the non-volatile memory cannot be well controlled.

SUMMARY OF INVENTION

In view of the forgoing, this invention provides a non-volatile memory cell that contains metal nano-particles with better uniformity for charge storage.

This invention also provides a method for fabricating a non-volatile memory cell The method uses thermal dissociation for forming metal nano-particles to improve the uniformity of the same.

The non-volatile memory cell of this invention comprises a substrate, a charge-trapping layer, a gate and a source/drain. The charge-trapping layer comprises an insulating layer and metal nano-particles contained therein, wherein the metal nano-particles are formed with thermal dissociation of an oxide of the same metal. The gate is disposed on the charge-trapping layer, and the source/drain is located in the substrate beside the gate.

The method for fabricating a non-volatile memory cell of this invention is described as follows. A first insulating layer, a metal oxide layer and a second insulating layer are sequentially formed on a substrate. An annealing is performed to convert the metal oxide layer to a plurality of metal nano-particles with thermal dissociation, while the first insulating layer, the second insulating layer and the metal nano-particles together constitute a charge-trapping layer. A gate is formed on the charge-trapping layer, and then a source/drain is formed in the substrate beside the gate.

Moreover, in the method for fabricating a non-volatile memory cell of this invention, several metal oxide layers and insulating layers can be alternately formed on the second insulating layer after the second insulating layer is formed. The metal oxide layers will be converted to multi layers of metal nano-particles in the subsequent annealing step.

As mentioned above, the metal oxide layer(s) is (are) converted to one or multi layers of metal nano-particles with thermal dissociation in this invention. Since the metal nano-particles capable of storing charges are isolated from each other, two bits can be stored in one non-volatile memory cell of this invention as in the case of the conventional SONOS memory device. Meanwhile, the uniformity of the nano-particles in this invention is better as compared with the prior art, and the electrical properties of the non-volatile memory can be well controlled.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1–3 illustrate a process flow of fabricating a non-volatile memory cell in a cross-sectional view according to a preferred embodiment of this invention, wherein FIG. 3 illustrates the structure of the non-volatile memory cell.

DETAILED DESCRIPTION

Figure 3:
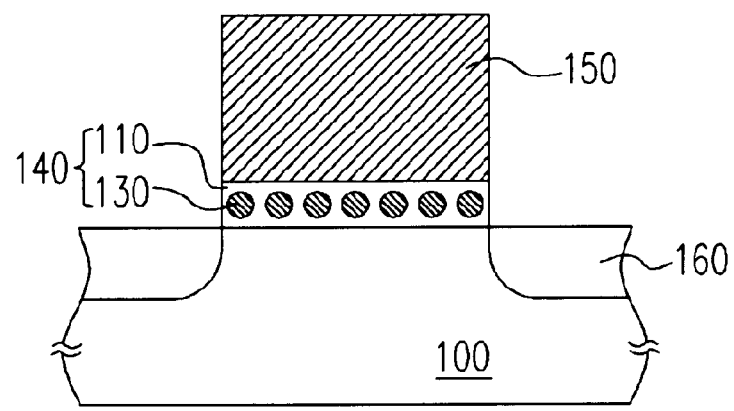

FIG. 3 illustrates the structure of a non-volatile memory cell in a cross-sectional view according to the preferred embodiment of this invention.

Referring to FIG. 3, the non-volatile memory cell comprises a substrate 100, a charge-trapping layer 140, a gate 150, and a source/drain 160. The substrate 100 is, for example, a p-type silicon substrate. The charge-trapping layer 140 is disposed on the substrate 100, comprising an insulating layer 110 and metal nano-particles 130 contained therein. The insulating layer 110 may comprise silicon oxide, $Al_2O_3$, $HfO_2$ or $ZrO_2$, while silicon oxide is more preferable. The metal nano-particles 130 are formed with thermal dissociation of an oxide of the same metal, and may comprise platinum (Pt), iridium (Ir), ruthenium (Ru) or hafnium (Hf), while platinum is more preferable because the temperature for thermal dissociation of platinum oxide is lower. The diameter of the metal nano-particles 130 ranges from 1 nm to 20 nm, and the distance between two metal nano-particles 130 ranges from 1 nm to 10 nm. The gate 150 is disposed on the charge-trapping layer 140, and comprises a material such as doped polysilicon. The source/drain 160 is located in the substrate 100 beside the gate 150, and is doped with an n-type dopant such as phosphorous (P) or arsenic (As).

Figure 1:
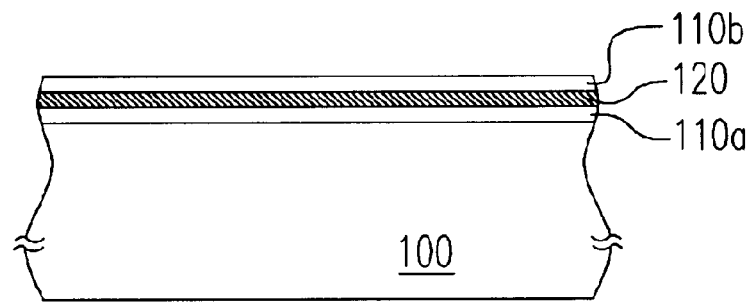
Figure 2:
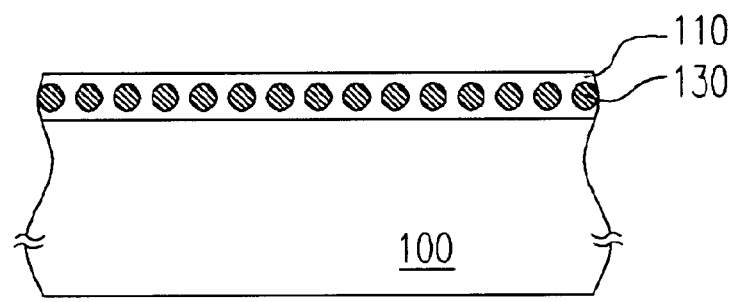

FIGS. 1–3 illustrate a process flow of fabricating a non-volatile memory cell in a cross-sectional view according to the preferred embodiment of this invention.

Referring to FIG. 1, a first insulating layer 110a, a metal oxide layer 120 and a second insulating layer 110b are sequentially formed on a substrate 100. The first insulating layer 110a is formed with a method such as reactive sputtering or thermal oxidation, the metal oxide layer 120 with a method such as reactive sputtering, and the second insulating layer 110b with a method such as reactive sputtering or chemical vapor deposition (CVD). The first and the second insulating layers 110a and 110b may comprise the same material or different materials, and each of them comprises, for example, silicon oxide, $Al_2O_3$, $HfO_2$ or $ZrO_2$, while silicon oxide is more preferable. The metal oxide layer 120 comprises a material such as platinum oxide ($PtO_x$), iridium oxide, ruthenium oxide or hafnium oxide, while $PtO_x$ (x=0.1–10) is more preferable because the temperature for thermal dissociation of $PtO_x$ is lower.

As the first/second insulating layer 110a/b comprises silicon oxide formed with reactive sputtering, a silicon target is used with argon and oxygen gas introduced. As the metal oxide layer 120 comprises $PtO_x$ formed with reactive sputtering, a platinum target is used with argon and oxygen gas introduced, and the sputtering conditions are analogous as in the case of silicon oxide sputtering. For example, the substrate temperature is room temperature, the flow rates of argon and oxygen gas are 5 sccm and 15 sccm, respectively, and the sputtering pressure is 20 mTorr for both the $SiO_x$ deposition and the $PtO_x$ deposition, while the sputtering rate for depositing $SiO_x$ is 3 nm/min, and that for depositing $PtO_x$ is 2 nm/min.

Referring to FIG. 2, an annealing is performed to convert the metal oxide layer 120 to a plurality of metal nano-particles 130 with thermal dissociation. The metal nano-particles 130 and the first and the second insulating layers 110a and 110b (insulating layer 110) together constitute a charge-trapping layer 140. The annealing is preferably under vacuum for preventing contamination. As the metal oxide layer 120 comprises $PtO_x$, the annealing can be conducted at 420° C. for 60 minutes, for example. The diameter of the platinum nano-particles formed with thermal dissociation ranges from about 1 nm to about 20 nm, and the distance between two platinum nano-particles ranges from about 1 nm to about 10 nm.

Referring to FIG. 3, a gate 150 is then formed on the charge-trapping layer 140, and the charge-trapping layer 140 is also patterned after the gate 150 is finished, wherein the gate 150 comprises a material such as doped polysilicon. Thereafter, a source/drain 160 is formed in the substrate 100 beside the gate 150 with a method such as ion implantation. The source/drain 160 is doped with phosphorous (P) or arsenic (As).

Besides, the metal nano-particles in the insulating layer can be formed with multi layers for increasing the number of trapping sites or other purposes. A method for forming multi layers of metal nano-particles is illustrated in FIGS. 4–5.

Figure 4:
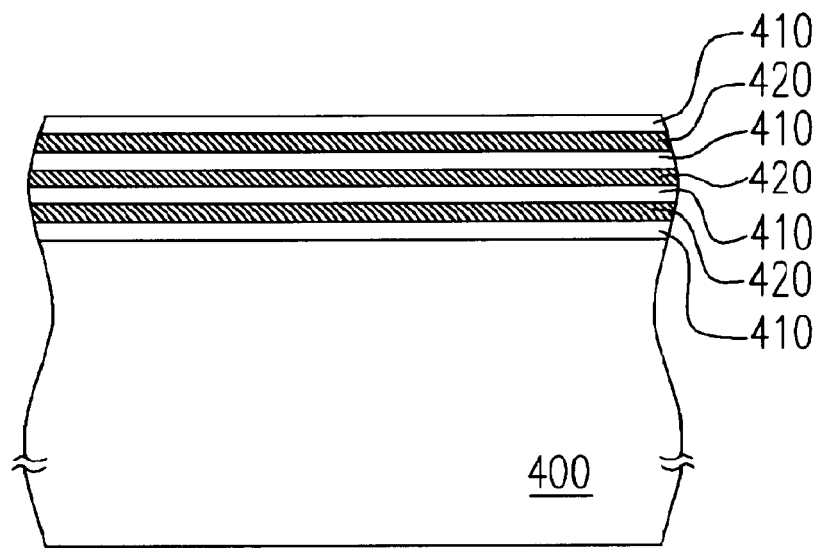
FIGS. 4–5 illustrates a method for forming multi layers of metal nano-particles according to the preferred embodiment of this invention.
Figure 5:
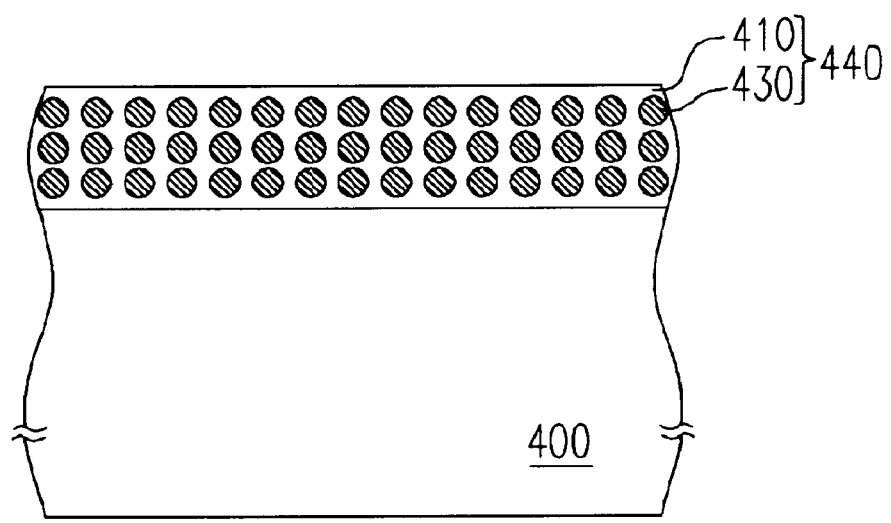

Referring to FIGS. 4–5, several insulating layers 410 and metal oxide layers 420 are alternately formed on a substrate 400 to constitute a multi-layer structure. Thereafter, an annealing is performed under the same conditions as mentioned above, and the metal oxide layers 420 are converted to multi layers of metal nano-particles 430 with thermal dissociation. The multi layers of metal nano-particles 430 and the insulating layers 410 together constitute a charge-trapping layer 440.

Operations of the Non-Volatile Memory Cell

Figure 6:
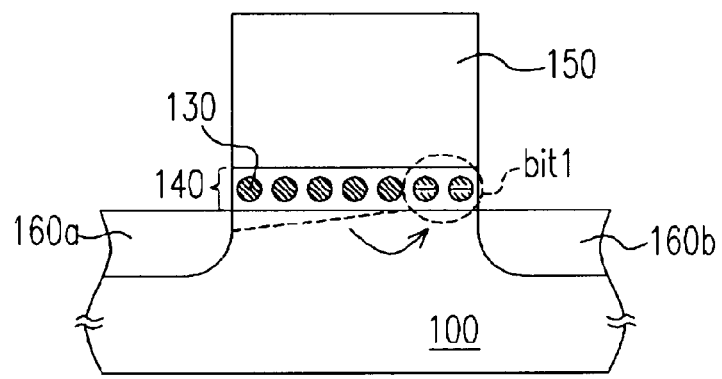
FIG. 6 illustrates a programming operation of the non-volatile memory cell illustrated in FIG. 3.
Figure 7:
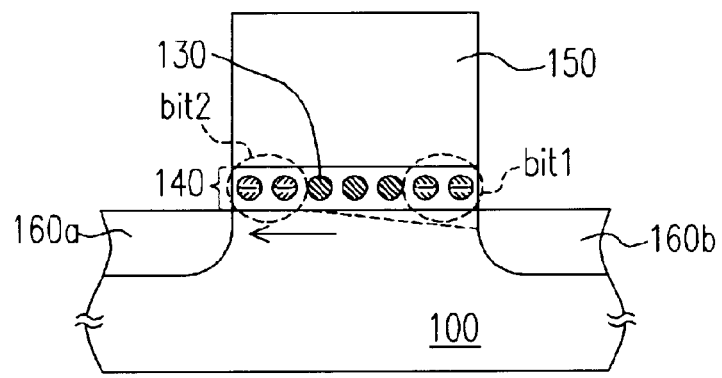
FIG. 7 illustrates a reading operation of the non-volatile memory cell illustrated in FIG. 3.
Figure 8:
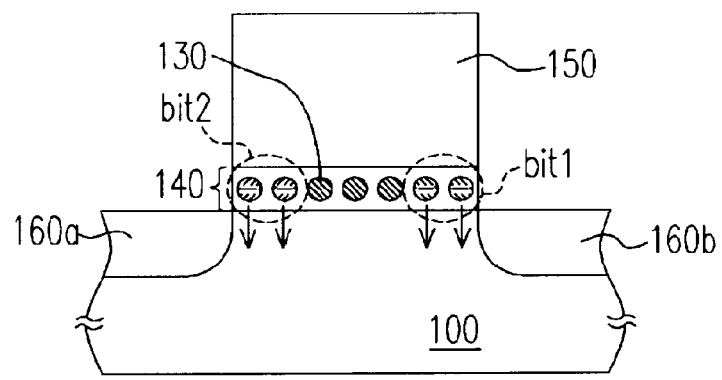
FIG. 8 illustrates an erasing operation of the non-volatile memory cell illustrated in FIG. 3.

FIGS. 6, 7 and 8 illustrate a programming operation, a reading operation and an erasing operation, respectively, of the non-volatile memory cell illustrated in FIG. 3.

Referring to FIG. 6, the non-volatile memory may be programmed with channel hot electron injection (CHEI) mechanism. As bit 1 is to be written to the memory cell, the gate 150 is applied with a high positive voltage, the source/drain 160a is grounded, and the source/drain 160b is applied with a sufficiently high voltage capable of inducing hot electrons in the channel near the source/drain 160b. The hot electrons are driven into the right edge of the charge-trapping layer 140 by the high positive voltage on the gate 150, and trapped in the metal nano-particles 130 therein. The trapped electrons will not move to the other metal nano-particles 130 because of the isolation of the insulating layer 110. Analogously, bit 2 (not shown) can be written to the left edge of the charge-trapping layer 140 and trapped in the metal nano-particles 130 therein by grounding the source/drain 160b and applying a sufficiently high voltage to the source/drain 160a.

Referring to FIG. 7, a bit in the memory cell can be read in the reverse direction. That is, as bit 1 is to be read, the source/drain 160a is applied with a positive voltage and the source/drain 160b is grounded, so that the current in the channel flows in a reverse direction as compared with the case of programming bit 1. If there are electrons stored in bit 1, as shown in FIG. 7, the portion of the channel under bit 1 is not turned on, and the current in the channel is in a low level. If bit 1 has not been written (not shown), the portion of the channel under bit 1 can be turned on, and the current in the channel is in a high level. Analogously, bit 2 can be read in a direction that is reverse to the current direction in the programming operation thereof.

Referring to FIG. 8, the non-volatile memory cell may be erased with Fowler-Nordheim tunneling mechanism. In the erasing operation, the gate 150 is applied with a high negative voltage, and the substrate 100 is grounded or applied with a positive voltage. With the electric field established between the gate 150 and the substrate 100, the electrons stored in both bit 1 and bit 2 are driven to the substrate 100 from the charge-trapping layer 140, so that the erasing operation is completed.

As mentioned above, the metal oxide layer is converted to metal nano-particles with thermal dissociation in this invention. Since the metal nano-particles capable of storing charges are isolated from each other, two bits can be stored in one non-volatile memory cell as in the case of the conventional SONOS memory. Meanwhile, the uniformity of the nano-particles in this invention is better as compared with the prior art, and the electrical properties of the non-volatile memory can be well controlled.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a non-volatile memory cell, comprising:

providing a substrate;

sequentially forming a first insulating layer, a metal oxide layer and a second insulating layer on the substrate;

performing an annealing to convert the metal oxide layer to a plurality of metal nano-particles with thermal dissociation, while the first insulating layer, the second insulating layer and the metal nano-particles together constitute a charge-trapping layer;

forming a gate on the charge-trapping layer; and forming a source/drain in the substrate beside the gate.

2. The method of claim 1, further comprising alternately forming several metal oxide layers and insulating layers on the second insulating layer after the second insulating layer is formed, so that multi layers of metal nano-particles are formed with the annealing.

3. The method of claim 1, wherein the annealing is conducted under vacuum.

4. The method of claim 1, wherein the metal oxide layer comprises platinum oxide ($PtO_x$) and the metal nano-particles comprise platinum, wherein x ranges from 0.1 to 10.

5. The method of claim 4, wherein the metal oxide layer is formed by performing a reactive sputtering process with a platinum target and an oxygen flow.

6. The method of claim 5, wherein the reactive sputtering process is conducted under room temperature.

7. The method of claim 6, wherein a flow rate of the oxygen flow is 15 sccm, a sputtering pressure is 20 mTorr, and a sputtering rate is 2 nm/mm.

8. The method of claim 4, wherein the annealing is conducted at about 420° C. for about 60 minutes.

9. The method of claim 1, wherein a diameter of the metal nano-particles ranges from about 1 nm to about 20 nm.

10. The method of claim 1, wherein a distance between two metal nano-particles ranges from about 1 nm to about 10 nm.

11. The method of claim 1, wherein the first and the second insulating layers comprise different materials.

12. The method of claim 1, wherein the first and the second insulating layers comprise the same material.

13. The method of claim 12, wherein the first and the second insulating layers both comprise silicon oxide.

14. The method of claim 1, wherein the metal oxide layer comprises iridium oxide, ruthenium oxide or hafnium oxide.

15. The method of claim 1, wherein the first and the second insulating layers comprise $Al_2O_3$, $HfO_2$ or $ZrO_2$.

* * * * *